United States Patent
Lee et al.

(10) Patent No.: US 7,294,540 B2
(45) Date of Patent: Nov. 13, 2007

(54) METHOD FOR MANUFACTURING A NITRIDE BASED SEMICONDUCTOR DEVICE

(75) Inventors: Jae Hoon Lee, Kyungki-do (KR); Jung Hee Lee, Daegu (KR)

(73) Assignee: Samsung Electro-Mechanics Co., Ltd., Suwon, Kyunki-Do (KR)

( * ) Notice: Subject to any disclaimer, the term of this patent is extended or adjusted under 35 U.S.C. 154(b) by 350 days.

(21) Appl. No.: 11/095,073

(22) Filed: Mar. 31, 2005

(65) Prior Publication Data
US 2006/0065929 A1    Mar. 30, 2006

(30) Foreign Application Priority Data
Sep. 24, 2004    (KR) .................. 10-2004-0076837

(51) Int. Cl.
*H01L 21/338*    (2006.01)
(52) U.S. Cl. .................. 438/172; 257/167; 257/194
(58) Field of Classification Search ............... 257/167, 257/194; 438/172
See application file for complete search history.

(56) References Cited

U.S. PATENT DOCUMENTS

| 7,112,860 B2* | 9/2006 | Saxler ................ 257/416 |
| 2005/0139818 A1* | 6/2005 | Lee at al. ................ 257/14 |

FOREIGN PATENT DOCUMENTS

KR    10-2004-0046479 A    6/2004

* cited by examiner

*Primary Examiner*—Fernando L. Toledo
(74) *Attorney, Agent, or Firm*—Volpe and Koenig P.C.

(57) ABSTRACT

Provided is a nitride-based semiconductor device in which a SAW filter and a HFET are integrated on a single substrate, as well as a method for manufacturing the same. The nitride-based semiconductor device comprises a semi-insulating GaN layer formed on a substrate, a plurality of electrodes for a SAW filter formed on one side of the semi-insulating GaN layer, an Al-doped GaN layer formed on the other side of the semi-insulating GaN layer, an AlGaN layer formed on the Al-doped GaN layer, and a plurality of electrodes for an HFET formed on the AlGaN layer. Both sides of the semi-insulating GaN layer have the same surface level.

9 Claims, 8 Drawing Sheets

METHOD FOR MANUFACTURING A NITRIDE BASED SEMICONDUCTOR DEVICE

RELATED APPLICATIONS

The present application is based on, and claims priority from, Korean Application Number 2004-76837, filed Sep. 24, 2004, the disclosure of which is incorporated by reference herein in its entirety.

BACKGROUND OF THE INVENTION

1. Field of the Invention

The present invention relates to a nitride-based semiconductor device, and a method for manufacturing the semiconductor device. More particularly, the present invention relates to a nitride-based semiconductor device in which a heterostructure field effect transistor (HFET) and a surface acoustic wave (SAW) filter are integrated on a single substrate, and a method for manufacturing the semiconductor device.

2. Description of the Related Art

With the recent development of communication technologies, there is an increasing need for high-speed and high-power electronic devices essential to ultrahigh-speed digital communication systems. For this reason, a number of studies on semiconductor materials which can accomplish high-speed and high-power operation characteristics are being actively undertaken. In particular, since GaN as a nitride-based semiconductor material has superior physical properties, e.g., large energy gap, superior thermal and chemical stability, high electron saturation velocity ($\sim 3 \times 10^7$ cm/sec), etc., it has strong potential for application to not only optoelectronic devices but also high-frequency and high-power electronic devices. Thus, a great deal of research on GaN has been conducted in the fields of devices and processes.

Nitride-based semiconductor electronic devices manufactured by employing GaN have many advantages in terms of a high breakdown voltage, maximum current density, stable high temperature operation, high thermal conductivity, and the like. Since heterostructure field effect transistors (HFETs) fabricated using an AlGaN/GaN heterojunction structure have band-discontinuity at the junction interface, a 2-dimensional electron gas (2-DEG) layer where many free electrons are crowded is formed at the interface, thereby further increasing the electron mobility. Further, since the GaN layer has a high surface-acoustic-wave velocity, superior temperature stability and polarization effects of piezoelectricity, it can be easily used for the fabrication of a band-pass filter which can be operated on the order of GHz or more.

In connection with SAW filters in the GHz band, recent research has been concentrated on materials having a high SAW propagation velocity, process techniques for forming electrode patterns with a width below sub-micron level, and methods for fabricating SAW filters using a harmonic frequency mode. However, conventional SAW filters fabricated using $LiNbO_3$, $LiTaO_3$ or quartz use different semiconductor materials from amplification devices, such as HFETs and heterostructure bipolar transistors (HBTs), used in RF integrated circuits. Under this circumstance, the SAW filters and amplification devices cannot be mounted on one chip, and instead have been mounted in a hybrid mode.

To solve this problem, Korean Patent Laid-open No. 2004-0046479 suggests a method for integrating a SAW filter and an HFET on a single wafer using a semi-insulating GaN layer. According to this method, however, the surface of the semi-insulating GaN layer is impaired in the course of dry etching the GaN layer to form the SAW filter, deteriorating the surface characteristics of the SAW filter.

Figure 1A:
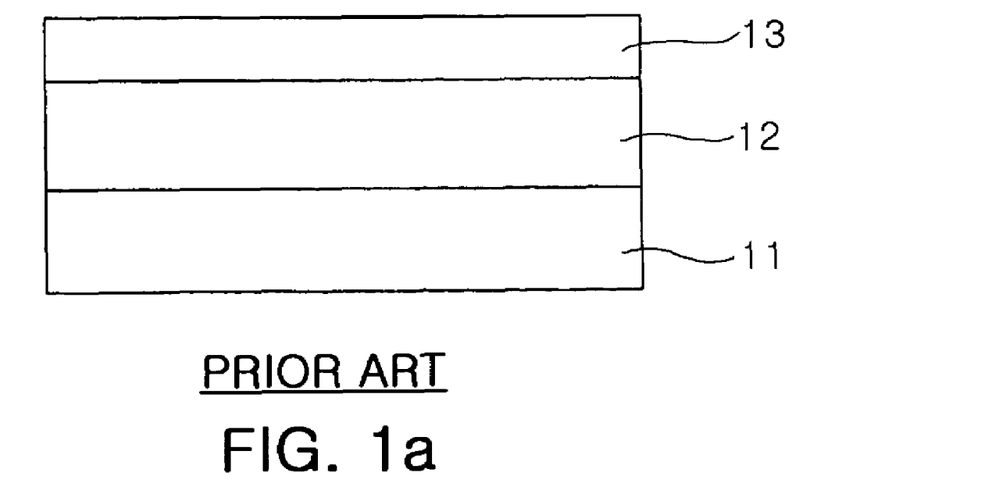
FIGS. 1a to 1d are cross-sectional views showing the steps of a conventional method for manufacturing a nitride-based semiconductor device in which a heterostructure field effect transistor and a surface acoustic wave filter are integrated on a single substrate.
Figure 1B:
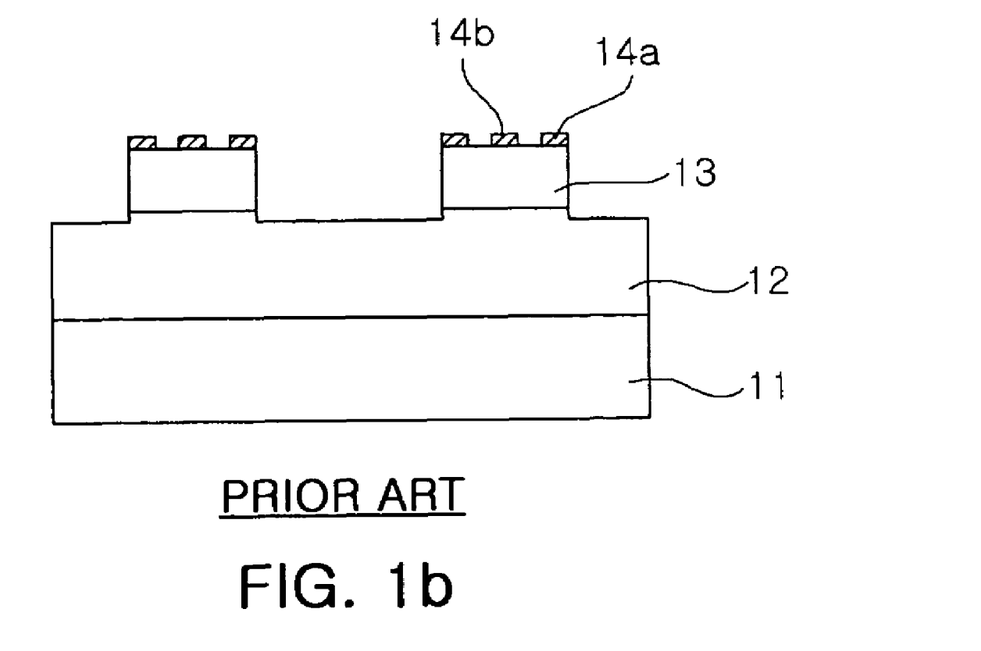

A conventional method for manufacturing an HFET and a SAW filter on a single substrate is illustrated in FIGS. 1a and 1b.

Figure 1C:
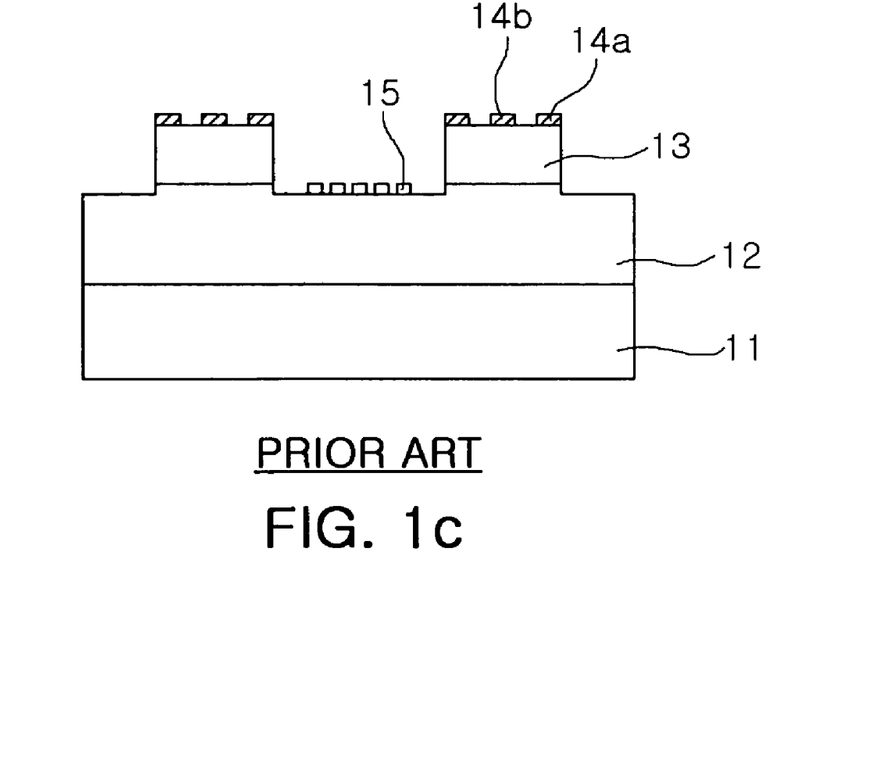
Figure 1D:
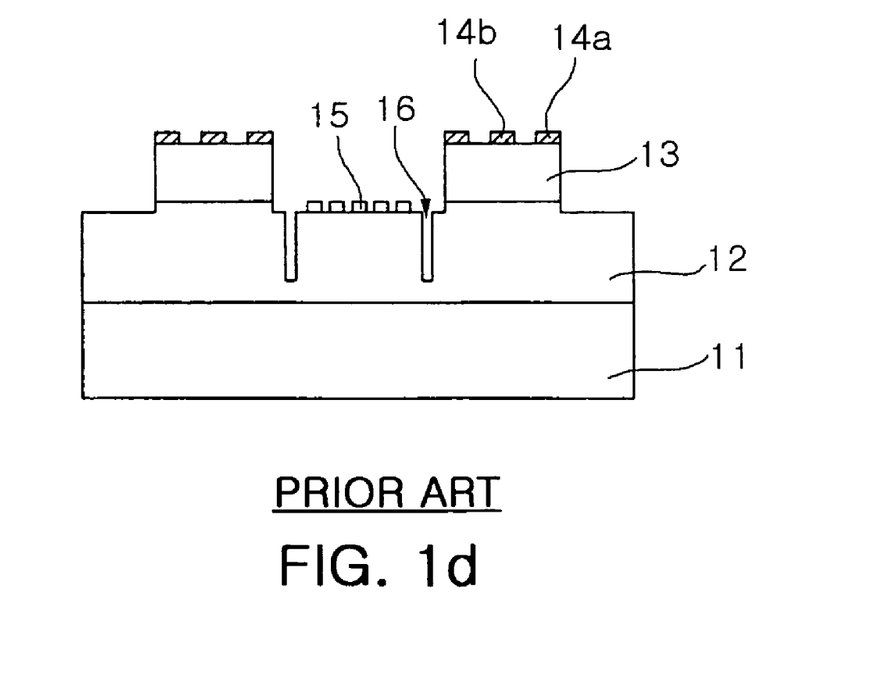

Referring first to FIG. 1a, a semi-insulating GaN layer 12 and an AlGaN layer 13 are sequentially formed on a substrate 11. Thereafter, predetermined regions of the AlGaN layer 13 are etched by dry etching, e.g., reactive ion etching, and then electrodes 14a and 14b for an HFET are formed on the unetched regions of the AlGaN layer 13 (FIG. 1b). At this time, the etching is excessively conducted in such a manner that some portions of the semi-insulating GaN layer 12 are etched. Electrodes 15 for a SAW filter are then formed on predetermined regions of the exposed portions, as shown in FIG. 1c. Finally, as shown in FIG. 1d, the semi-insulating GaN layer 12 is etched to form trenches 16 for separating the devices, i.e., HFET and SAW filter, from each other.

According to the conventional method, the portions of the GaN layer 12 in the region where a SAW filter is to be formed are etched during dry etching of the AlGaN layer 13. As a result, the surface of the GaN layer 12, acting as a piezoelectric material of the SAW filter, is impaired by the dry-etching and thus the surface characteristics are deteriorated. In addition, since additional dry-etching is required to separate the HFET from the SAW filter, the process is complicated and there may be a risk of misalignment upon dry etching the GaN layer. Furthermore, since an AlGaN layer is required to be formed on the semi-insulating GaN layer containing a large number of crystal defects to directly form a heterostructure, crystallinity in the vicinity of the heterostructure is degraded, making the fabrication of an HFET having a high-mobility channel more difficult, and the amount of leakage current increases due to the presence of a number of defects.

SUMMARY OF THE INVENTION

Therefore, the present invention has been made in view of the above problems, and it is an object of the present invention to provide a nitride-based semiconductor device in which an HFET having superior electrical properties resulting from improved crystallinity, and a SAW filter having good surface characteristics are integrated on a single substrate.

It is another object of the present invention to provide a method for manufacturing a nitride-based semiconductor device wherein damage to the surface of a SAW filter can be prevented, making it possible to fabricate a SAW filter having good surface characteristics, and crystallinity in the vicinity of a heterostructure between the SAW filter and an HFET can be improved, thus increasing the channel mobility and decreasing the amount of leakage current.

In accordance with one aspect of the present invention, the above objects can be accomplished by a nitride-based semiconductor device comprising a semi-insulating GaN layer formed on a substrate, a plurality of electrodes for a surface acoustic wave filter formed on one side of the semi-insulating GaN layer, an Al-doped GaN layer formed on the other side of the semi-insulating GaN layer, an AlGaN layer formed on the Al-doped GaN layer, and a plurality of electrodes for a heterostructure field effect transistor formed on the AlGaN layer, wherein both sides of the semi-insulating GaN layer have the same surface level.

To attain better crystallinity, the nitride-based semiconductor device may further comprise an undoped GaN layer formed between the Al-doped GaN layer and the AlGaN layer. In addition, the nitride-based semiconductor device may further comprise a buffer layer made of GaN grown at low temperature and formed between the substrate and the semi-insulating GaN layer.

Preferably, the semi-insulating GaN layer is formed through the following three steps. First, a GaN layer is grown at a first growth temperature (a first growth step), the GaN layer is further grown at increasing temperatures from the first growth temperature to a second growth temperature higher than the first growth temperature (a second growth step), and the GaN layer is further grown at the second growth temperature (a third growth step).

In accordance with another aspect of the present invention, there is provided a method for manufacturing a nitride-based semiconductor device, comprising the steps of: forming a semi-insulating GaN layer on a substrate; forming a protective layer on one side of the semi-insulating GaN layer on which a surface acoustic wave filter is to be formed; forming an AlGaN layer on the other side of the semi-insulating GaN layer on which a heterostructure field effect transistor is to be formed; removing the protective layer by wet etching; and forming a plurality of electrodes for a heterostructure field effect transistor on the AlGaN layer, and forming a plurality of electrodes for a surface acoustic wave filter on the region of the semi-insulating GaN layer where the protective layer is removed. In the method of the present invention, the electrodes for a heterostructure field effect transistor may be formed before or after the removal of the protective layer.

To lessen the difference in the lattice constant and thermal expansion coefficient between the substrate and the semi-insulating GaN layer, the method of the present invention may further comprise the step of forming a buffer layer on the substrate before the semi-insulating GaN layer is formed. The protective layer is preferably made of a silicon oxide or nitride film so that it can be easily removed by wet etching and does not damage the underlying semi-insulating GaN layer.

For improved crystallinity of an HFET, the method of the present invention may further comprise the step of, after the formation of the protective layer, forming an Al-doped GaN layer on the region of the semi-insulating GaN layer where a heterostructure field effect transistor is to be formed. For better crystallinity of an HFET, the method of the present invention may further comprise the step of forming an undoped GaN layer on the Al-doped GaN layer after the formation of the Al-doped GaN layer.

Preferably, the step of forming the semi-insulating GaN layer includes the sub-steps of growing a GaN layer at a first growth temperature (a first growth step), further growing the GaN layer at increasing temperatures from the first growth temperature to a second growth temperature higher than the first growth temperature (a second growth step), and further growing the GaN layer at the second growth temperature (a third growth step). It is preferable that the first growth temperature be between about 800° C. and about 950° C., and the second growth temperature be between about 1,000° C. and about 1,100° C.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Detailed description will be made of embodiments of the present invention with reference to the accompanying drawings. However, various modifications to the embodiments of the present invention may easily be made, and the scope of the present invention is not limited by the following embodiments. These embodiments are provided to those skilled in the art for a better understanding of the present invention. In the drawings, the shape and size of elements may be exaggerated for the purpose of clarity, and the same elements are denoted by the same reference numerals even though they are depicted in different drawings.

Figure 2:
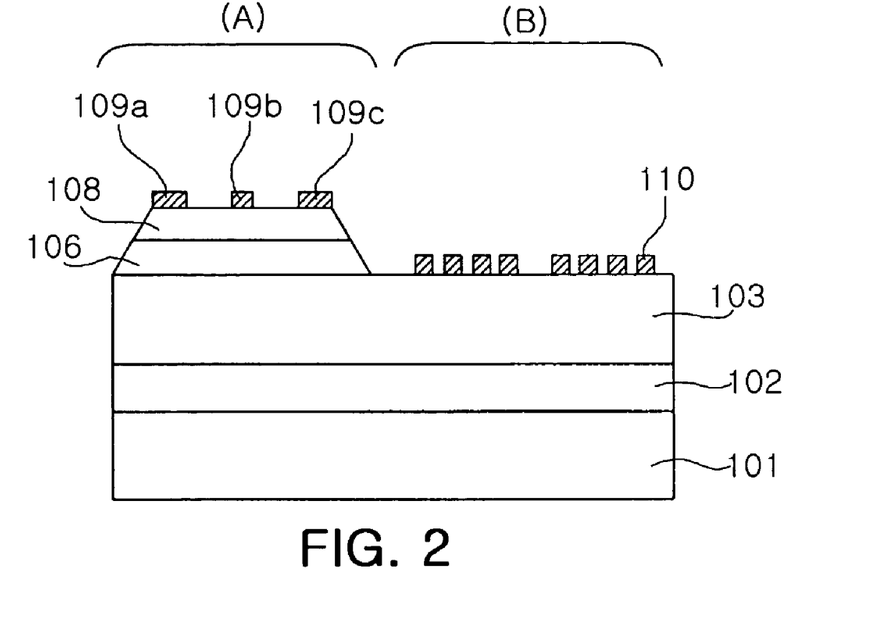
FIG. 2 is a cross-sectional view showing the structure of a nitride-based semiconductor device according to one embodiment of the present invention.
Figure 3:
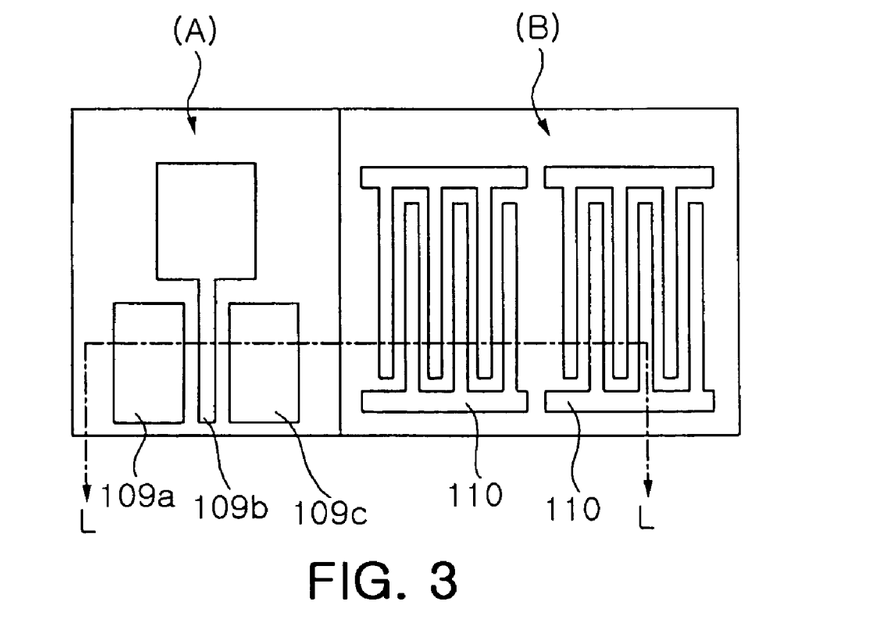
FIG. 3 is a top view of the nitride-based semiconductor device shown in FIG. 2.

FIG. 2 is a cross-sectional view showing the structure of a nitride-based semiconductor device according to one embodiment of the present invention, and FIG. 3 is a top view of the nitride-based semiconductor device shown in FIG. 2. Specifically, FIG. 2 is a cross-sectional view of FIG. 3, taken along the line L-L'. Referring to FIGS. 2 and 3, there is shown a nitride-based semiconductor device according to one embodiment of the present invention in which an HFET and a SAW filter are formed on a semi-insulating GaN layer 103, which is formed on a substrate 101. In the figures, (A) denotes a region where an HFET is formed, and (B) denotes a region where a SAW filter is formed.

As shown in FIGS. 2 and 3, the nitride-based semiconductor device includes a buffer layer 102 formed on the substrate 101. The substrate 101 may be a sapphire substrate, a SiC substrate, or a Si (111) substrate. The buffer layer 102 acts to lessen the difference in the lattice constant and thermal expansion coefficient between the substrate 101 and the semi-insulating GaN layer 103, and may be formed of GaN grown at low temperature.

The highly resistive semi-insulating GaN layer 103 is formed on the buffer layer 102. An Al-doped GaN layer 106, and an AlGaN layer 108 are sequentially layered on one side (i.e. (A)) of the semi-insulating GaN layer 103 to fabricate a heterostructure field effect transistor (HFET). A plurality of electrodes for an HFET are formed on the AlGaN layer 108. These electrodes for an HFET consist of a drain electrode 109a, a gate electrode 109b, and a source electrode 109c. On the other hand, a plurality of electrodes 110 for a SAW filter are formed on the other side (i.e. (B)) of the semi-insulating GaN layer 103 to fabricate a surface acoustic wave (SAW) filter. Accordingly, the semi-insulating GaN layer 103 formed on the single substrate 101 functions as not only a bulk substrate for the HFET, but also a piezoelectric material of the SAW filter. In this case, the semi-insulating GaN layer 103 preferably has a sheet resistance higher than $10^9$ Ω/sq in order to facilitate the separation between the devices, i.e., the HFET and the SAW filter.

To prevent degradation of crystallinity while forming a semi-insulating GaN layer having a high sheet resistance, the semi-insulating GaN layer 103 is preferably formed through low-temperature growth and continuous high-temperature growth, as described below. Because the semi-insulating GaN layer 103 has a high sheet resistance, it can act to separate the HFET from the SAW filter. Accordingly, there is no need to additionally form trenches (reference numeral 16 in FIG. 1d) for separating the devices, unlike in the prior art.

Doped Al present in the Al-doped GaN layer 106 reduces the number of defects, enabling fabrication of an HFET having improved crystallinity. It is preferable to control the amount of doped Al to 1 mole % or less in order to prevent adverse effects caused by excessive Al doping. According to this embodiment, a 2-dimensional electron gas (2-DEG) layer is formed in the vicinity of the interface between the Al-doped GaN layer 106 and the AlGaN layer 108.

As can be seen from FIG. 2, the upper face of the region (i.e. (A)) of the semi-insulating GaN layer 103 where the HFET is formed has the same level as that of the region (i.e. (B)) of the semi-insulating GaN layer 103 where the SAW is formed. In contrast, in the conventional nitride-based semiconductor device shown in FIG. 1d, since the semi-insulating GaN layer 12 is selectively dry-etched, the upper face of the region where the SAW filter is formed has a lower level than that of the region where the HFET is formed. The reason for this difference in the level of the upper face is that no selective dry-etching of the semi-insulating GaN layer 103, acting as a piezoelectric material of the SAW filter, is conducted in the method of the present invention. Therefore, the nitride-based semiconductor device according to this embodiment can prevent damage to the surface of the piezoelectric material because no dry etching is conducted on the region of the semi-insulating GaN layer 103 where the SAW filter is formed.

Figure 4:
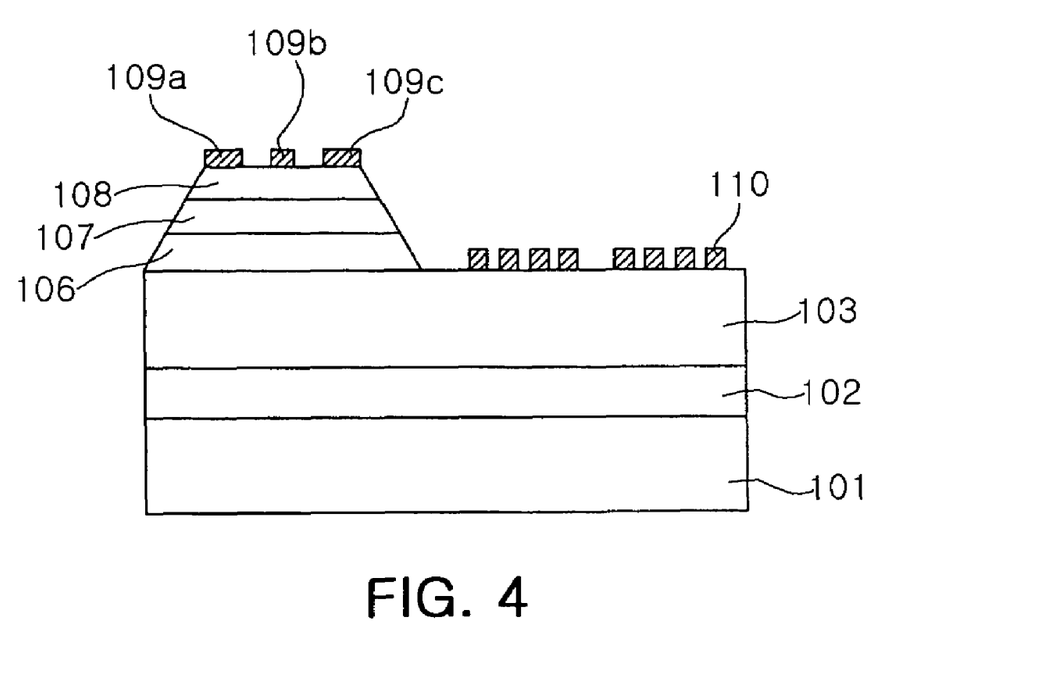
FIG. 4 is a cross-sectional view showing the structure of a nitride-based semiconductor device according to another embodiment of the present invention.

FIG. 4 is a cross-sectional view showing the structure of a nitride-based semiconductor device according to another embodiment of the present invention. A nitride-based semiconductor device shown in FIG. 4 has the same structure as the nitride-based semiconductor device shown in FIG. 2, except that an undoped GaN layer 107 is further formed between the Al-doped GaN layer 106 and the AlGaN layer 108. According to this embodiment, a 2-dimensional electron gas layer of an HFET is formed at the interface between the undoped GaN layer 107 and the AlGaN layer 108.

Based on the improved crystallinity of the Al-doped GaN layer 106, the undoped GaN layer 107 has better crystallinity. Thus, the mobility of electrons present in the 2-dimensional electron gas layer formed at the interface between the undoped GaN layer 107 and the AlGaN layer 108 is increased, and the electrical properties of the HFET are further improved. The additional formation of the undoped GaN layer 107 enables removal of Al impurities present in the 2-dimensional electron gas layer, and thus the phenomenon wherein Al present in the 2-dimensional electron gas layer becomes a cause of impurity scattering at high temperature can be prevented, thereby inhibiting the reduction of mobility generated during operation at high temperature.

Hereinafter, methods for manufacturing nitride-based semiconductor devices according to embodiments of the present invention will be explained. Unlike in the conventional method, no selective dry etching on some portions of a semi-insulating GaN layer, which is caused by excessive etching of the overlying layer, is conducted. Instead, a protective layer is selectively deposited on the semi-insulating GaN layer, an HFET structure is re-grown, and then the protective layer is removed by wet etching. By this procedure, the surface of the semi-insulating GaN layer on which a SAW filter is to be formed is protected.

FIGS. 5 to 9 are cross-sectional views showing the steps of a method for manufacturing a nitride-based semiconductor device according to one embodiment of the present invention.

Figure 5:
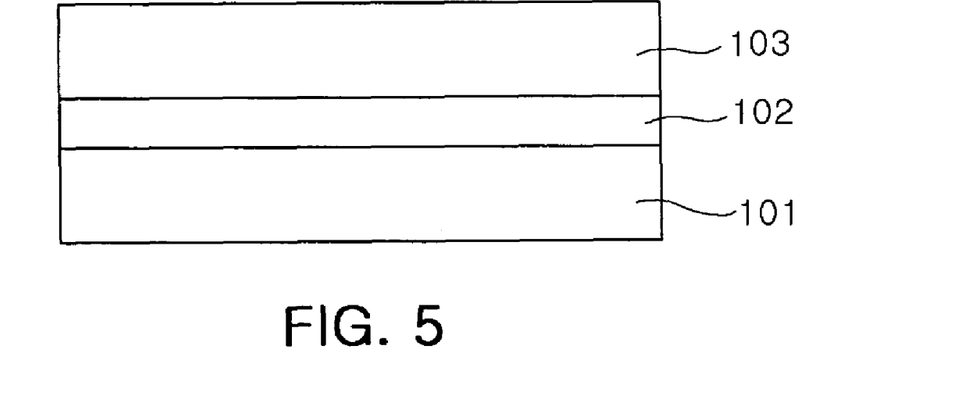
FIGS. 5 to 9 are cross-sectional views showing the steps of a method for manufacturing a nitride-based semiconductor device according to one embodiment of the present invention.

Referring first to FIG. 5, a buffer layer 102 made of GaN grown at a low temperature of about 550° C. is formed on a single substrate 101 selected from a sapphire substrate, a SiC substrate and a Si substrate having a growth direction of (111), and then a semi-insulating GaN layer 103 is formed thereon. At this time, it is preferred that the buffer layer 102 is subjected to annealing while the temperature is raised from about 800° C. to about 950° C. for several minutes before the semi-insulating GaN layer 103 is formed, rather than the semi-insulating GaN layer 103 being directly formed on the buffer layer 102. The annealing of the buffer layer 102 allows grains present in the buffer layer 102 to have a relatively small size and a high density. In this manner, the number of Ga vacancies capable of capturing electrons, acting as carries, increases, and thus the concentration of carriers is lowered, resulting in an improvement in the insulation of the buffer layer 102 and a reduction in the amount of leakage current.

To ensure a sheet resistance as high as $10^9$ Ω/sq and prevent the degradation of crystallinity, the semi-insulating GaN layer 103 is preferably formed through the following three growth steps of a GaN thin film. Specifically, a GaN thin film is first grown at a first growth temperature (preferably, about 800° C. to about 950° C.) within about 3 minutes, is further grown at increasing temperatures from the first growth temperature to a second growth temperature (preferably, about 1,000° C. to about 1,100° C.) for about 5 minutes, and is further grown at the second growth temperature to form the final semi-insulating GaN layer 103 having a desired thickness. It is preferred that the semi-insulating GaN layer has a thickness of about 1 μm to about 4 μm. The semi-insulating GaN layer formed through the foregoing three growth steps prevents the degradation in the crystallinity of an HFET to be formed thereon while providing a very high resistance (about $10^9$ Ω/sq or above).

Figure 6:
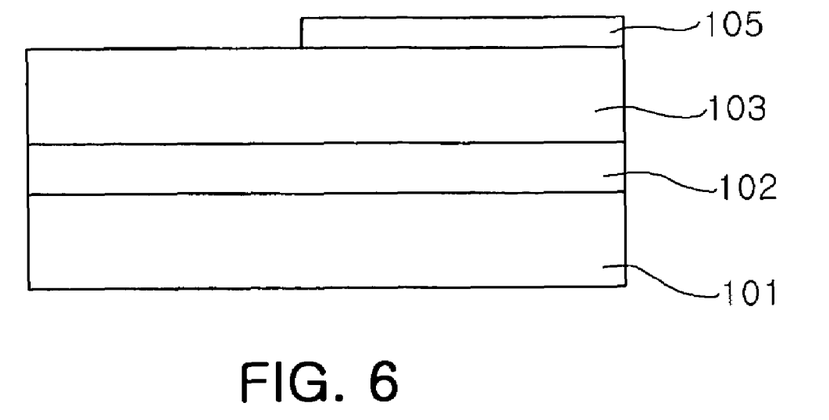

Next, as shown in FIG. 6, a protective layer 105 made of $Si_3N_4$, $SiO_2$ or the like is formed on the semi-insulating GaN layer 103 so as to protect a region where a SAW filter is to be formed. The region of the semi-insulating GaN layer 103 not covered by the protective layer 105 is a region where an HFET is to be formed.

Figure 7:
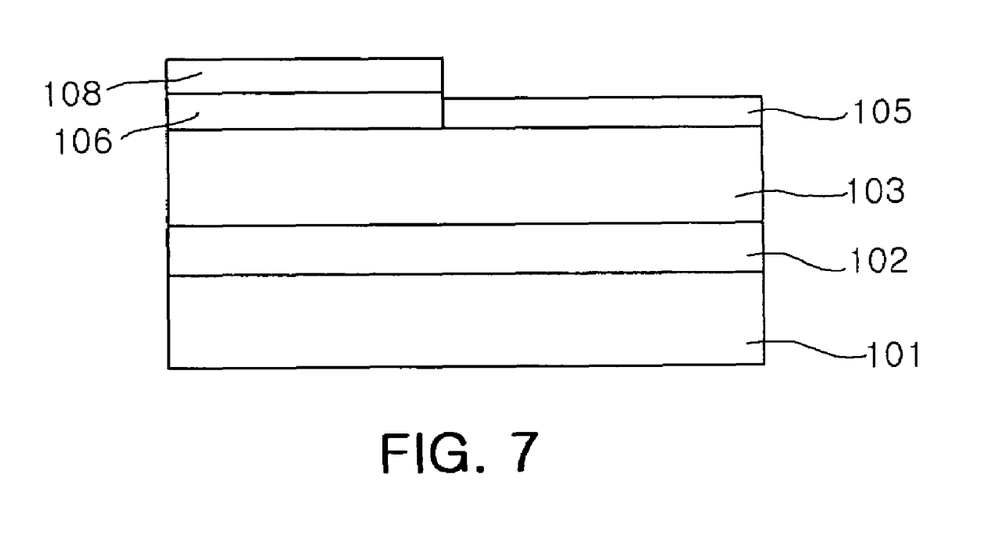

Thereafter, as shown in FIG. 7, an Al-doped GaN layer 106 and an AlGaN layer 108 are sequentially grown on the uncovered region in a reaction chamber. Since Al impurities present in the Al-doped GaN layer 106 play a role in the removal of defects, they further improve the crystallinity of an HFET to be formed. Since the Al-doped GaN layer 106 and the AlGaN layer 108 constituting a heterostructure are grown at high temperature, they do not grow on the protective layer 105 made of $Si_3N_4$, $SiO_2$, or the like.

Figure 8:
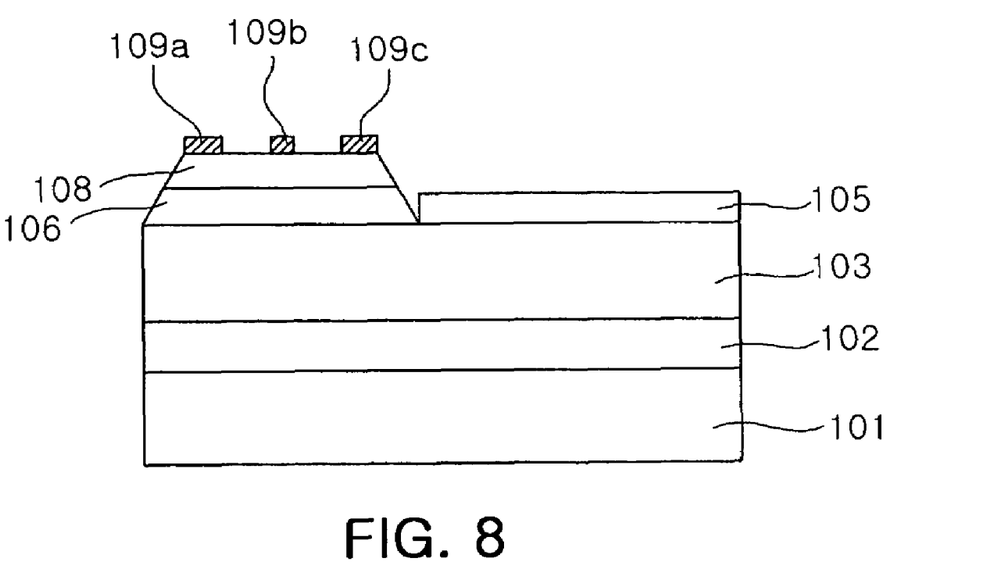

As shown in FIG. 8, the side face of the region, including the GaN layer 106 and the AlGaN layer 108, where an HFET is to be formed is etched in the shape of a mesa by inductively coupled plasma-reactive ion etching (ICP-RIE). Next, a drain electrode 109a, a gate electrode 109b, and a source electrode 10c for an HFET are formed on the AlGaN layer 108 to accomplish an HFET structure.

Figure 9:
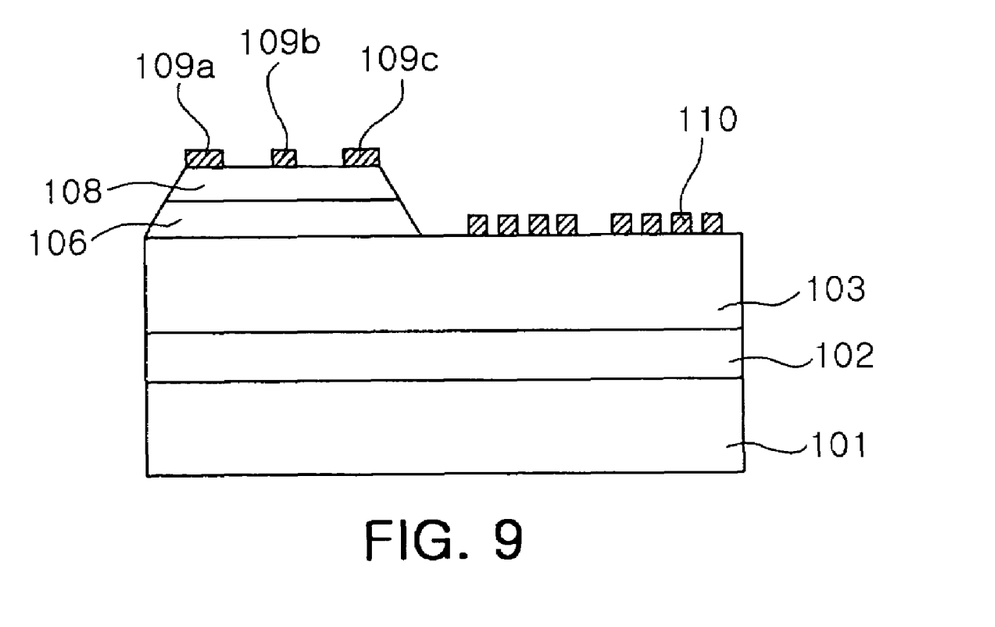

Thereafter, as shown in FIG. 9, the protective layer 105 is removed by wet etching. A hydrofluoric acid (HF)-based etchant is used in the case where the protective layer 105 is an oxide film made of $SiO_2$, while a phosphoric acid ($H_3PO_4$)-based etchant is used in the case where the protective layer 105 is a nitride film made of $Si_3N_4$. Importantly, when the protective layer 105 is removed by wet etching, the surface of the semi-insulating GaN layer 103 is not impaired, unlike by dry etching, e.g., reactive ion etching. Therefore, the surface characteristics of a surface acoustic wave (SAW), where the surface characteristics of a piezoelectric material are considered as being important, can be greatly improved.

Next, as shown in FIG. 9, after the protective layer 105 is removed, a plurality of input and output electrodes for a SAW filter are formed on the exposed portion of the semi-insulating GaN layer 103. In this manner, the final nitride-based semiconductor device in which the HFET and the SAW filter are integrated on a single substrate is manufactured. According to this embodiment, since the semi-insulating GaN layer 103 can separate the SAW filter from the HFET due to its high sheet resistance, there is no need to form an additional trench for separating the devices.

In this embodiment, although the Al-doped GaN layer 106 is formed on the semi-insulating GaN layer 103 in order to improve the crystallinity of the HFET, the AlGaN layer 108 may be formed in direct contact with the semi-insulating GaN layer 103. Without the Al-doped GaN layer 106, the crystallinity of the HFET is degraded, but the surface characteristics of the SAW filter are still greatly improved. Therefore, in situations where the surface characteristics of a SAW filter are thought to be more important than the channel mobility of an amplification device, the formation of the Al-doped GaN layer 106 can be omitted.

Figure 10:
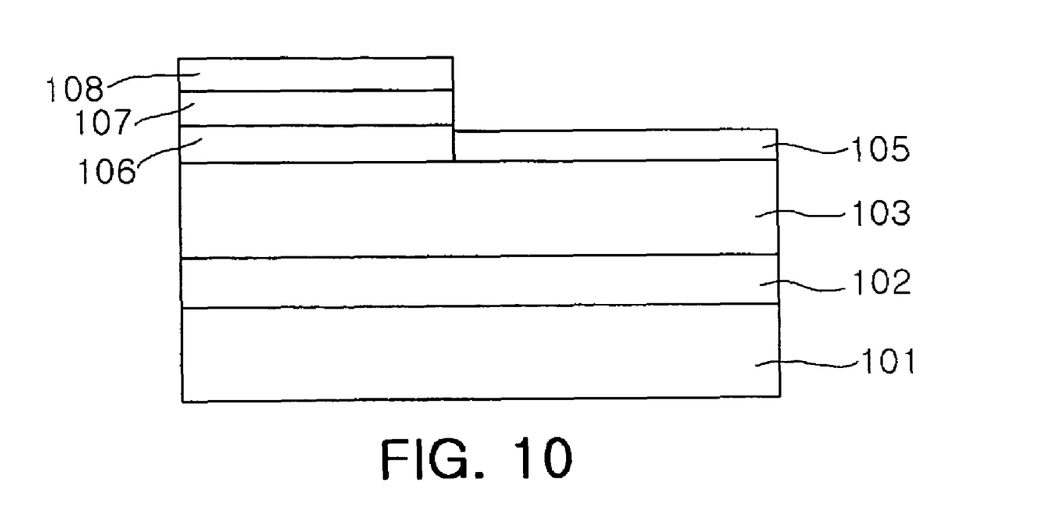
FIGS. 10 to 12 are cross-sectional views showing the steps of a method for manufacturing a nitride-based semiconductor device according to another embodiment of the present invention.
Figure 11:
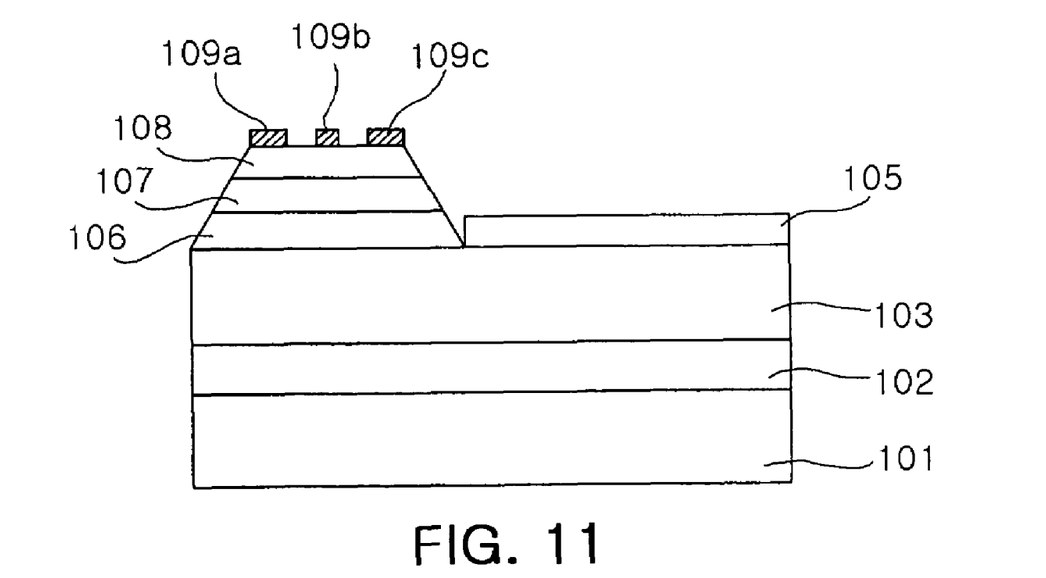
Figure 12:
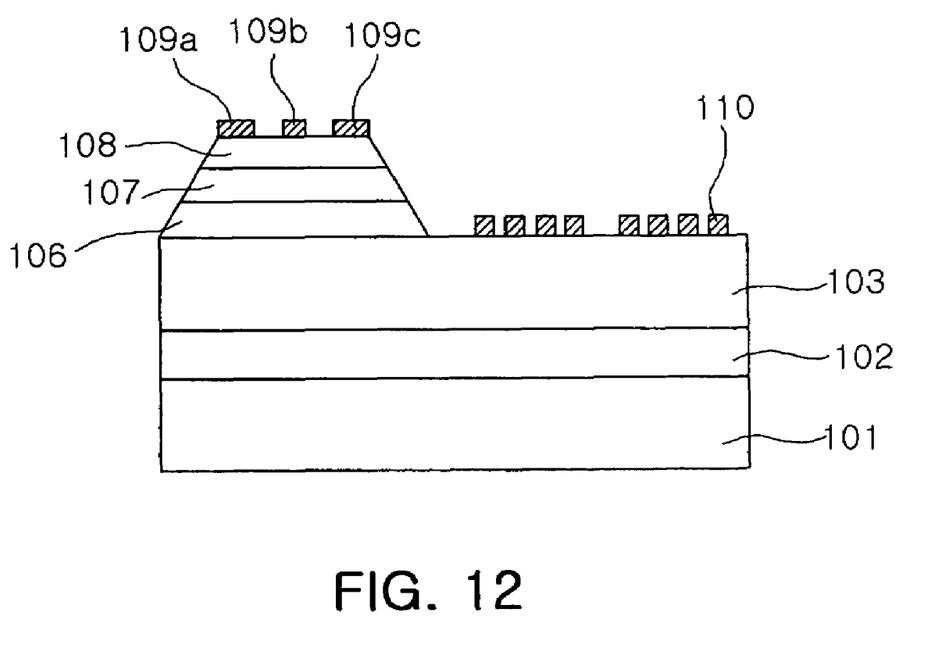

FIGS. 10 to 12 are cross-sectional views showing the steps of a method for manufacturing a nitride-based semiconductor device according to another embodiment of the present invention. The method shown in FIGS. 10 to 12 is the same as the method of the previous embodiment, except that an undoped GaN layer 107 is additionally formed after the formation of the Al-doped GaN layer 106 and prior to the formation of the AlGaN layer 108.

First, the steps shown in FIGS. 5 and 6 are carried out. Thereafter, as shown in FIG. 10, the Al-doped GaN layer 106, the undoped GaN layer 107, and the AlGaN layer 108 are sequentially grown on the region of the semi-insulating GaN layer 103 not covered by the protective layer 105.

As explained above, the undoped GaN layer 107 acts to further improve the crystallinity of an HFET to be formed, together with the Al-doped GaN layer 106, and solves the problem of a decrease in mobility caused upon operation at high temperature. In this connection, the Al-doped GaN layer 106 and the undoped GaN layer 107 preferably have a thickness ranging from 0.1 μm to 1 μm.

Thereafter, as shown in FIG. 11, the side face of the region, including the GaN layers 106 and 107, and the AlGaN layer 108, where an HFET is to be formed is etched in the shape of a mesa, and then a drain electrode 109a, a gate electrode 109b and a source electrode 109c are formed on the AlGaN layer 108 to accomplish an HFET structure.

Next, referring to FIG. 12, the protective layer 105 made of an oxide or nitride film is wet-etched by using an appropriate etchant, and then a plurality of electrodes 110 for a SAW filter are formed on the exposed portion of a semi-insulating GaN layer 103, as in the previous embodiment of the present invention. In this manner, the final nitride-based semiconductor device is manufactured. According to this embodiment, since the protective layer 105 prevents damage to the surface of the semi-insulating GaN layer 103 on which the SAW filter is formed, a SAW filter having superior surface characteristics can be fabricated. In addition, the undoped GaN layer 107 formed on the Al-doped GaN layer 107 can further improve the crystallinity of the HFET, resulting in an increase in the channel mobility of electrons. Although the electrodes 109a, 109b and 109c for the HFET are formed prior to the removal of the protective layer 105 in accordance with the foregoing embodiments of the present invention, they may be formed after the removal of the protective layer 105.

Although the present invention has been described herein with reference to the foregoing embodiments and the accompanying drawings, the scope of the invention is defined by the claims that follow. Accordingly, those skilled in the art will appreciate that various substitutions, modifications and changes are possible, without departing from the technical spirit of the present invention as disclosed in the accompanying claims.

As apparent from the above description, according to the present invention, the protective layer can protect the surface of the semi-insulating GaN layer on which the SAW filter is formed, and thus damage to the surface of a piezoelectric material of the SAW filter is prevented. Accordingly, the SAW filter has superior surface characteristics. In addition, the protective layer improves the crystallinity of the HFET, and thus the electron mobility of the HFET is increased and the amount of leakage current is decreased. Accordingly, the HFET has improved operational characteristics. Furthermore, the SAW filter having improved surface characteristics and the HFET having increased electron mobility can be integrated on a single substrate to manufacture the GaN-based semiconductor device, thereby easily accomplishing high-density integration of high-power and high-frequency electronic devices.

Moreover, since the use of the highly resistive, semi-insulating GaN layer as a bulk substrate for the HFET and a piezoelectric material for the SAW filter avoids the need to form an additional element for separating the devices, the method of the present invention is advantageous in terms of simplified processing and can prevent the risk of misalignment accompanied by the formation of an additional element for separating the devices.

What is claimed is:

1. A method for manufacturing a nitride-based semiconductor device, comprising the steps of:
    forming a semi-insulating GaN layer on a substrate;
    forming a protective layer on one side of the semi-insulating GaN layer on which a surface acoustic wave filter is to be formed;
    forming an AlGaN layer on the other side of the semi-insulating GaN layer on which a heterostructure field effect transistor is to be formed;
    removing the protective layer by wet etching; and
    forming a plurality of electrodes for a heterostructure field effect transistor on the AlGaN layer, and forming a plurality of electrodes for a surface acoustic wave filter on the region of the semi-insulating GaN layer where the protective layer is removed.

2. The method according to claim 1, wherein the electrodes for a heterostructure field effect transistor are formed before the removal of the protective layer.

3. The method according to claim 1, wherein the electrodes for a heterostructure field effect transistor are formed after the removal of the protective layer.

4. The method according to claim 1, wherein the step of forming the semi-insulating GaN layer includes the substeps of:
   growing a GaN layer at a first growth temperature (a first growth step);
   further growing the GaN layer at increasing temperatures from the first growth temperature to a second growth temperature higher than the first growth temperature (a second growth step); and
   further growing the GaN layer at the second growth temperature (a third growth step).

5. The method according to claim 4, wherein the first growth temperature is between about 800° C. and about 950° C., and the second growth temperature is between about 1,000° C. and about 1,100° C.

6. The method according to claim 1, further comprising the step of, after the formation of the protective layer and prior to the formation of the AlGaN layer, forming an Al-doped GaN layer on a region of the semi-insulating GaN layer where a heterostructure field effect transistor is to be formed.

7. The method according to claim 6, further comprising the step of, after the formation of the Al-doped GaN layer and prior to the formation of the AlGaN layer, forming an undoped GaN layer on the Al-doped GaN layer.

8. The method according to claim 1, wherein the protective layer is made of a silicon oxide or nitride film.

9. The method according to claim 1, further comprising the step of forming a buffer layer on the substrate before the formation of the semi-insulating GaN layer.

\* \* \* \* \*